United States Patent [19]

Tezuka et al.

[11] Patent Number: 5,660,708

[45] Date of Patent: Aug. 26, 1997

[54] PROCESS FOR MANUFACTURING A LEAD FRAME

[75] Inventors: Yoshimaro Tezuka, Oume; Katsuhisa Tokunaga; Mitsuyuki Kakimoto, both of Hamura; Shigeki Ogawa; Miyuki Tani, both of Oume; Satoshi Kobayashi, Hamura; Kiyotaka Sasaki; Motoyuki Tomizawa, both of Oume, all of Japan

[73] Assignee: Sumitomo Metal Mining Company, Limited, Tokyo, Japan

[21] Appl. No.: 561,329

[22] Filed: Nov. 21, 1995

[30] Foreign Application Priority Data

Nov. 21, 1994 [JP] Japan .................................. 6-286315
Dec. 19, 1994 [JP] Japan .................................. 6-314571

[51] Int. Cl.$^6$ ............................ C25D 5/34; B05D 3/00
[52] U.S. Cl. ....................... 205/205; 205/658; 205/682; 205/683; 205/263; 205/265; 427/328
[58] Field of Search ............................ 205/219, 658, 205/205, 682, 683, 263, 265; 427/307, 309, 327–328; 204/DIG. 9

[56] References Cited

U.S. PATENT DOCUMENTS

| | | | |
|---|---|---|---|
| 2,582,020 | 1/1952 | Emery | 205/658 |
| 3,630,864 | 12/1971 | Nakamura et al. | 204/658 |
| 4,125,444 | 11/1978 | Inoue | 204/DIG. 9 X |
| 4,545,875 | 10/1985 | Riley | 204/DIG. 9 X |
| 4,548,683 | 10/1985 | Huang et al. | 204/DIG. 9 X |
| 5,242,556 | 9/1993 | Masuzawa | 204/DIG. 9 X |

*Primary Examiner*—Donald R. Valentine
*Attorney, Agent, or Firm*—Watson Cole Stevens Davis, P.L.L.C.

[57] ABSTRACT

It is an object of this invention to provide a process for manufacturing a lead frame by polishing a blank for a lead frame electrolytically and plating the electrolytically polished surface of the blank with a metal, which process enables the electrolytic polishing of the blank to be continued for a long time by employing a contactless electrolytic polishing apparatus, and can form an electrolytically polished surface which is sufficiently smooth to allow it to be plated with a very good metal coating.

The contactless electrolytic polishing apparatus is employed for applying a direct current with ripples having a frequency of 40 to 120 Hz alternately to the anode and cathode in an electrolytic polishing tank filled with an electrolytic polishing solution, so that the time for which the blank positioned between both electrodes functions as the anode may be at least 3.3 times longer than that for which it functions as the cathode, and the blank is, then, plated with a metal by employing a customary method.

13 Claims, 3 Drawing Sheets

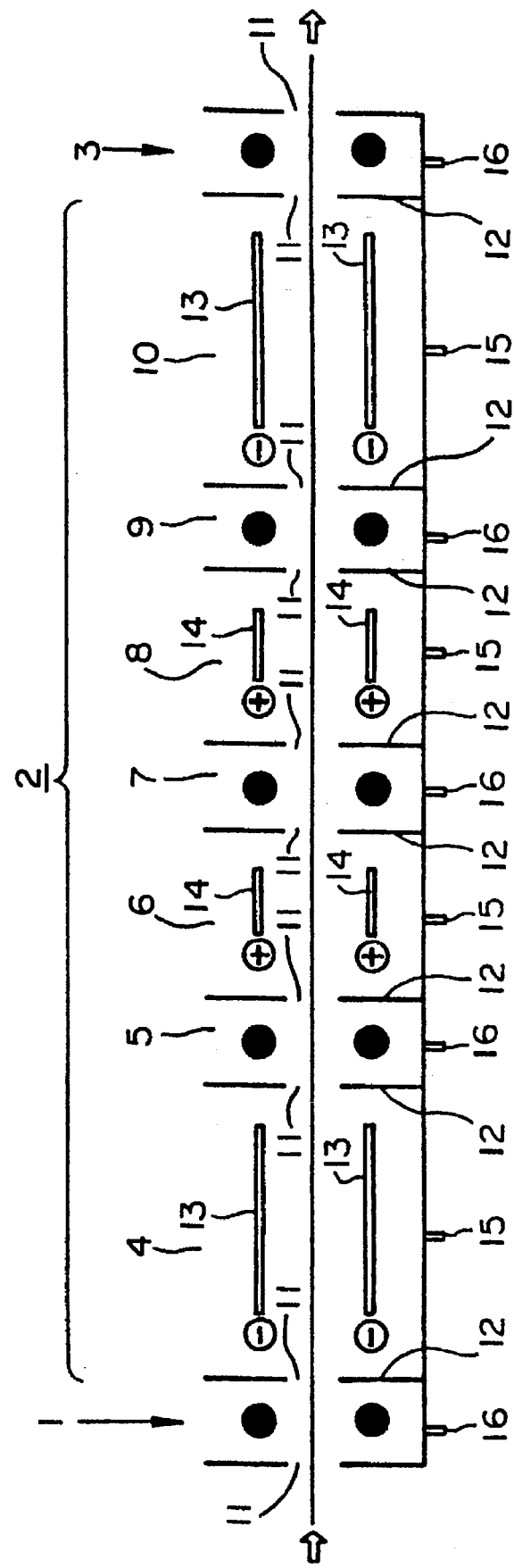

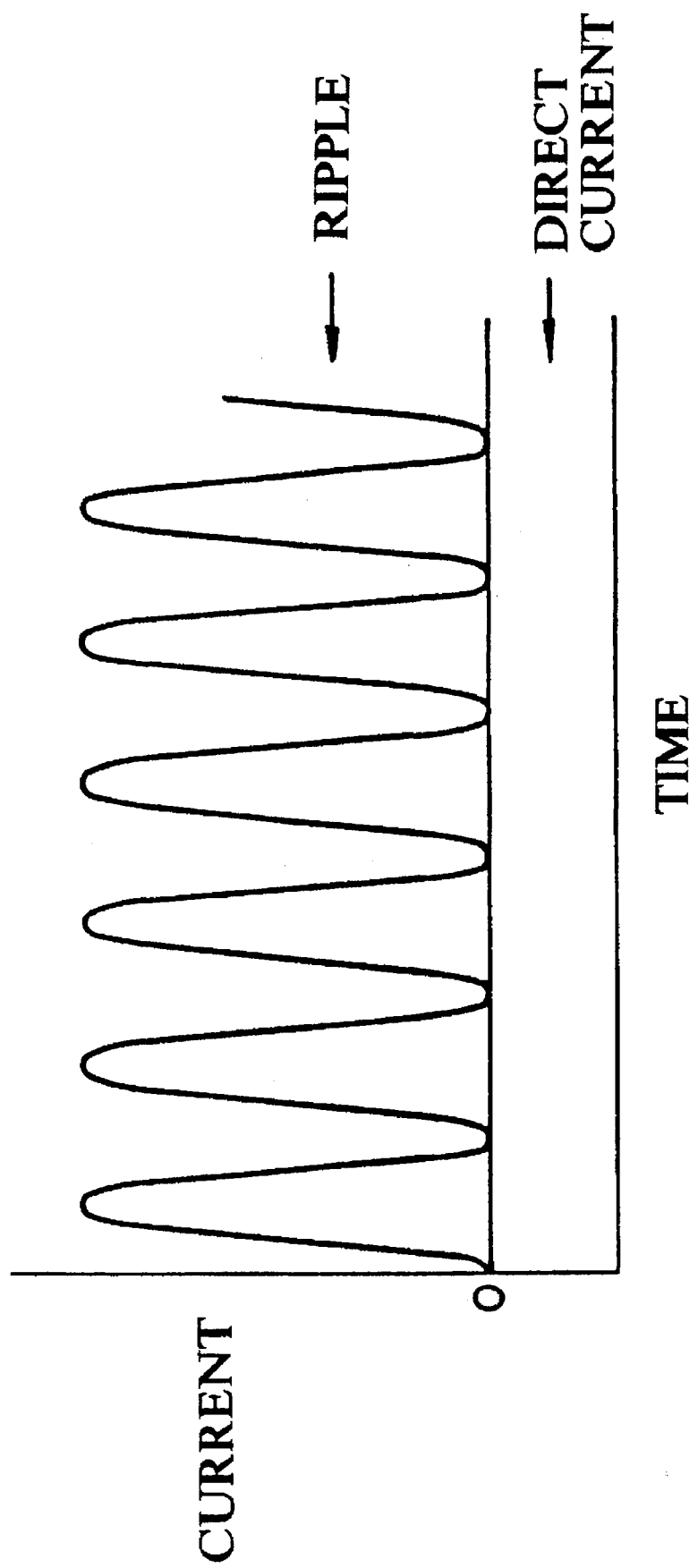

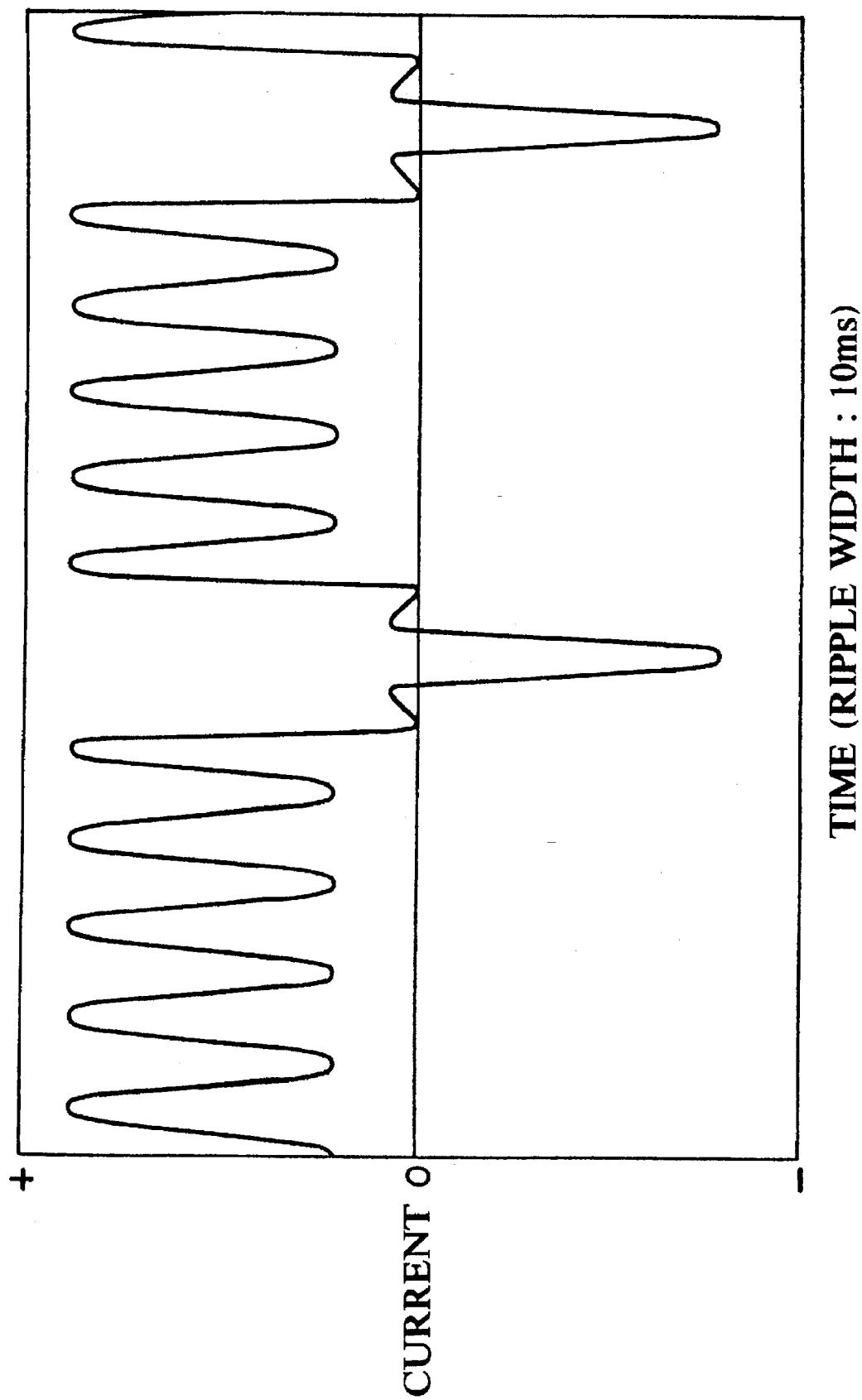

PROCESS FOR MANUFACTURING A LEAD FRAME

BACKGROUND OF THE INVENTION

1. Field of the Invention

This invention relates to a process for manufacturing a lead frame which includes the electrolytic polishing of a blank for a lead frame as a pretreatment prior to plating, and more particularly, to an improvement in the method for the electrolytic polishing of a blank for a lead frame which employs a contactless electrolytic polishing apparatus.

2. Description of the Prior Arts

The Prior Art

A lead frame as a material for an electronic part is usually manufactured by punching a rolled material, such as copper or steel, to prepare a blank for a lead frame, polishing the blank electrolytically to give it a smooth surface and remove oil and fat, etc., from any protruding and recessed portion thereof, removing any oxide film from the electrolytically polished surface of the blank, and plating it with a metal such as copper, silver or palladium.

The smoothness of the polished blank has a critical effect on its metal plating, and particularly when a palladium-plated lead frame is manufactured, it has been necessary to employ a complicated process which includes plating the electrolytically polished blank with a strike of nickel after removing any oxide film therefrom, forming an electroplated layer of nickel having a thickness of 1 to 2 microns thereon, and plating it with palladium.

Moreover, the conventional electrolytic polishing process has been incomplete in the removal of any protrusion and concavity from the surface of the blank, and therefore, its subsequent plating with a strike of copper or nickel provides a lead frame which is defective due to the protuberances on or unevenness of its plated surface, thereby presenting an obstacle to a reduction of cost.

Therefore, if it is possible to decrease any protrusion and concavity from the surface of the blank for a lead frame, it is possible not only to overcome those problems, but also to plate the electrolytically polished blank with a metal directly or after coating it with an inexpensive strike of copper, and thereby achieve a drastic reduction of cost, depending on the material of the blank. Accordingly, various attempts have been made to obtain an improved method for electrolytic polishing.

A method employing a contactless electrolytic polishing apparatus has been proposed as one of the electrolytic polishing methods which have hitherto been under consideration. This method employing a contactless electrolytic polishing apparatus enables the electrolytic polishing of the blank without causing its deformation, since its polishing can be done without its contact with the electrode, but the mere passing of a direct current between the two poles for the electrolytic polishing of the blank has been unable to give it a satisfactory smoothness, and moreover, the short life of the electrode has made it impossible to continue any electrolytic polishing operation for a long period of time.

SUMMARY OF THE INVENTION

As a result of our inquiry into the cause of the problem, we, the inventors of this invention, have found that if a simple direct current is used as an electrolytic current, bubbles form on the surface of a blank for a lead frame during its polishing and cause its passivation disabling its satisfactory polishing, and that if a conventional acidic solution is used for electrolytic polishing, and if a conventional material, such as hard lead, stainless steel, or other iron based metal, is used for the electrode, the electrode is dissolved in the acidic polishing solution, and has a varying current density, thereby not only disabling any satisfactory electrolytic polishing, but also failing to withstand a long time of continuous operation.

In view of the various problems as pointed out above in connection with the process for manufacturing a lead frame which includes a method employing a contactless electrolytic polishing apparatus for the electrolytic polishing of a blank for a lead frame, it is an object of this invention to provide a process for manufacturing lead frames which enables a long period of continuous operation in the electrolytic polishing of blanks for lead frames, and can form an electro-polished surface which is sufficiently smooth to allow very good metal plating, and an electrolytic polishing apparatus which is used therein.

The above object is attained by a process for manufacturing lead frames by polishing blanks for lead frames electrolytically and plating the electrolytically polished surfaces of the blanks with a metal, wherein the electrolytic polishing of the blanks is carried out by employing a contactless electrolytic polishing apparatus, and applying a direct current containing a ripple having a frequency of 40 to 120 Hz alternately to the anode and cathode in an electrolytic polishing tank filled with an electrolytic polishing solution, while the time for which a blank positioned between both electrodes functions as the anode is at least 3.3 times longer than that for which it functions as the cathode, whereafter the blanks are plated with a metal by a customary method.

As a result of our study, we have found that it is possible to obtain a polished blank for a lead frame having a satisfactory smoothness if its electrolytic polishing is carried out by employing a contactless electrolytic polishing apparatus and applying alternately to the anode and cathode a direct current containing a frequency ripple having a waveform as stated above, while the ratio in time of its application to the anode and cathode is controlled as stated above. As it is needless to say that the use of a contactless electrolytic polishing apparatus enables a blank for a lead frame to be polished without contacting any electrode, it is possible to perform its satisfactory polishing without causing its deformation.

In the process of this invention for manufacturing a lead frame, the electrolytic polishing of its blank is preferably carried out after its degreasing and cleansing. Moreover, the plating of the electrolytically polished blank with a metal is preferably carried out after its chemical polishing, or its electrolytic polishing by a cyanogen solution, so that the electrolytically polished blank may have a still better smoothness.

The electrolytic polishing solution which is most preferably used for electrolytic polishing in accordance with this invention is a neutral electrolyte containing 30 to 40 g of tripolyphosphoric acid, 8 to 12 g of phosphoric acid, 8 to 12 g of boric acid, 1 to 3 g of potassium carbonate and 0.08 to 0.2 g of a nonionic surfactant per liter, and having a pH of 4.8 to 5.8 and a temperature of 35° C. to 45° C., though a conventional acidic electrolytic polishing solution can also be used. The direct current containing a ripple and applied to the surface of the blank preferably has an average density of 1.0 to 4.0 $A/dm^2$.

If an acidic electrolytic solution is used, it is preferable to use one containing 20 to 40 g of sulfuric acid, 40 to 80 g of ammonium chloride and 0.08 to 0.25 g of a nonionic surfactant per liter and having a temperature of 45° C. to 50° C., while employing an average current density of 1.0 to 3.0 A/dm$^2$. In the event that an acidic electrolytic polishing solution is used, the electrodes are preferably of titanium or a titanium alloy.

The metal with which the blank is to be plated after electrolytic polishing is silver or copper, or most preferably, palladium. Although the blank as electrolytically polished can be plated with any such metal directly, it is preferable to coat it with a strike of copper beforehand if the purpose for which the lead frame will be used calls for a still higher degree of adhesion and smoothness, and if the blank is of an iron-based metal and is to be plated with palladium, it is particularly advisable to coat it with a strike of copper before plating it with palladium in order to ensure good results.

BRIEF DESCRIPTION OF THE DRAWINGS

FIG. 1 is a diagrammatic sectional view showing by way of example a contactless electrolytic polishing apparatus which is used for this invention;

FIG. 2 is a diagram showing a pattern of the basic waveform of a direct current containing a ripple and applied to the cathode or anode for the purpose of this invention; and FIG. 3 is a diagram showing a pattern of the waveform of a direct current containing a ripple and applied to the anode and cathode alternately by switching over the pattern of the basic waveform generated by a current generator as shown in FIG. 2.

DETAILED DESCRIPTION OF THE INVENTION

The process of this invention for manufacturing lead frames will now be described in detail based on a preferred form of embodiment. This form of process employs a neutral electrolytic polishing solution containing 30 to 40 g of tripolyphosphoric acid, 8 to 12 g of phosphoric acid, 8 to 12 g of boric acid, 1 to 3 g of potassium carbonate and 0.08 to 0.2 g of a nonionic surfactant per liter, and having a pH of 4.8 to 5.8 and a temperature of 35° C. to 45° C. when polishing a blank for a lead frame electrolytically by employing a contactless electrolytic polishing apparatus, and applying a direct current containing a ripple having a frequency of 40 to 120 Hz alternately to the anode and cathode in an electrolytic polishing tank filled with the electrolytic polishing solution, while the time for which the blank positioned between both electrodes functions as the anode is at least 3.3 times longer than that for which it functions as the cathode.

A particularly important aspect of this form of embodiment lies in the use of a mixed solution of tripolyphosphoric and phosphoric acids as the electrolytic polishing solution. The use of tripolyphosphoric and phosphoric acids together ensures the formation of a smooth electrolytically polished surface on the blank. Tripolyphosphoric acid functions as a principal polishing agent, and phosphoric acid as a promotor for a polishing speed. Therefore, the use of one of them alone fails to give the blank a smooth surface as intended by this invention.

The polishing solution has a pH of 4.8 to 5.8, since this is the pH range in which the electrodes are not dissolved in a short time, thereby disabling the continuous operation of the electrolytic polishing apparatus over a long period of time, even if the electrodes may be of an inexpensive iron-based metal. Moreover, if the pH is within this range, the contamination of the blank surface by the substitution reaction of iron and copper is negligible, even if the polishing of a blank of a copper-based metal may be immediately followed by the polishing of a blank of an iron-based metal employing the same electrolytic polishing solution. The control of the pH is done by adding potassium carbonate and boric acid to the polishing solution, and in this case, boric acid acts as a pH buffer agent to minimize any pH variation resulting from the progress of electrolytic polishing.

The addition of a nonionic surfactant to the solution is intended for dissolving in the solution any oil remaining on the surface of the blank, and facilitating the separation of bubbles forming on the blank surface during its electrolytic polishing. As a result, the polishing solution remains in contact with the blank surface throughout its electrolytic polishing and thereby enables it to proceed efficiently.

The temperature of the electrolytic polishing solution affects the condition of a polished surface which can be obtained. If the solution temperature is too low, the polishing speed is too slow to give a good polished surface, but if it is too high, the polishing speed is too fast to give a smooth polished surface. Such being the case, this invention employs a solution temperature of 35° C. to 45° C. which the most satisfactory polished surface can be obtained.

The average current density indicates the average amount of electric current passing across unit area of the blank, and its adequate range enabling the formation of a good polished surface depends on the composition of the electrolytic polishing solution. The neutral electrolytic polishing solution as described above enables a good polished surface to be formed when an average current density of 1.0 to 4.0 A/dm$^2$ is employed.

Description will now be made of the preferred form of process for the manufacture of lead frames with reference to the drawings. The manufacture of a lead frame basically consists of the step of polishing a blank for the lead frame electrolytically, and the step of plating the electrolytically polished blank with a metal. A contactless electrolytic polishing apparatus is employed for the electrolytic polishing step. FIG. 1 is a diagrammatic sectional view showing by way of example an electrolytic polishing tank in a contactless electrolytic polishing apparatus which can be used for the purpose of this invention. In FIG. 1, 1 is a blank supply roll, 2 is an electrolytic polishing tank, and 3 is a blank discharge roll. A blank for a lead frame is fed through the blank supply roll 1, is electrolytically polished in the electrolytic polishing tank 2, and is discharged through the blank discharge roll 3.

The electrolytic polishing tank 2 comprises a first cathode-containing vessel 4, a first solution-discharge vessel 5, a first anode-containing vessel 6, a second solution-discharge vessel 7, a second anode-containing vessel 8, a third solution-discharge vessel 9 and a second cathode-containing vessel 10 which are arranged in that order in the direction of travel of the blank, and each of those vessels is defined by partitions 12 having openings 11 through which the blank to be electrolytically polished is passed.

The first and second cathode-containing vessels 4 and 10 are each provided with electrodes 13 connected to the cathode in a source of power supply (not shown), and located above and/or below a horizontal plane joining the openings 11, and in the positions where they are immersed in the electrolytic polishing solution, and the first and second anode-containing vessels 6 and 8 are each provided with electrodes 14 connected to the anode in the source of power supply (not shown), and located above and/or below the horizontal plane joining the openings 11, and in the positions where they are immersed in the solution.

The first and second cathode-containing vessels 4 and 10 and the first and second anode-containing vessels 6 and 8 are each provided at the bottom thereof with an inlet port 15 for the electrolytic polishing solution, and the blank supply roll 1, the first, second and third solution-discharge vessels 5, 7 and 9 and the blank discharge roll 3 are each provided at the bottom thereof with an outlet port 16 for discharging the electrolytic polishing solution used for polishing.

According to this invention, the electrolytic polishing of a blank for a lead frame is carried out by employing the contactless electrolytic polishing apparatus of the construction as described above, and applying a direct current containing a ripple having a frequency of 40 to 120 Hz alternately to the anode and cathode in the electrolytic polishing tank 2 filled with the electrolytic polishing solution, while the time for which the blank positioned between both electrodes functions as the anode is at least 3.3, but not more than 6 times longer than that for which it functions as the cathode. If it is more than 6 times, a reduction in current efficiency undesirably results in a long polishing time and thereby a high cost of polishing.

Description will now be made of the waveform of a direct current having a ripple which is applied to the electrolytic polishing tank 2. FIG. 2 is a diagram showing the basic waveform of a current having a ripple which is applied to the anode, or cathode, and FIG. 3 is a diagram showing by way of example the waveform of a current as actually applied alternately to the anode and cathode in accordance with this invention by switching the current having the basic waveform as stated above.

As is obvious from FIG. 2, the current applied to the electrolytic polishing tank is a direct current on which a ripple (or pulsating component) is superimposed, and is obtained by rectifying an alternating current and smoothing it in a smoothing device. No detailed description is made of any device for obtaining a current having such a waveform, since it does not form an essential part of this invention. According to the waveform of a current shown in FIG. 3 as actually applied to the electrolytic polishing tank, the application of a direct current with five ripples (each ripple having a width of 10 ms) to the anode, and then, a direct current with one ripple to the cathode forms a cycle which is thereafter repeated for applying current with the same waveform. The numbers of the ripples toward the anode and cathode can be altered within the scope of this invention.

The use for electrolytic polishing of a direct current with ripples as shown in FIG. 3 made it possible to obtain a blank for a lead frame having an electrolytically polished surface which was sufficiently smooth to allow its direct plating with a metal. The ripple width, or frequency and the ratio of the time for which current is applied to the anode to that for which it is applied to the cathode, have a significant bearing on the smoothness of a polished surface, and more specifically, it is essential to select a ripple frequency of 40 to 120 Hz and ensure that the time for which the blank to be polished functions as the anode be at least 3.3, but not more than six times longer than that for which it functions as the cathode.

After its electrolytic polishing, the blank surface can be plated directly with a metal, such as silver, copper or palladium, by a customary method. If the blank is of an iron-based metal, however, its metal plating is preferably carried out after its plating with a strike of copper in order to achieve a still higher level of smoothness and adhesive strength. A still higher level of smoothness and adhesive strength may, however, be required of metal plating on a lead frame, depending on its use, and in such a case, it is preferable that prior to its metal plating, the electrolytically polished surface of the blank be given a short time of chemical polishing, or electrolytic polishing using a cyanogen electrolyte, as has hitherto been usual.

Another form of process embodying this invention employs an acidic electrolytic polishing solution containing 20 to 40 g of sulfuric acid, 40 to 80 g of ammonium chloride and 0.08 to 0.25 g of a nonionic surfactant per liter and having a temperature of 45° C. to 50° C. When this electrolytic polishing solution is employed, it is preferable to employ an average current density of 1.0 to 3.0 A/dm$^2$. When an acidic electrolytic polishing solution is employed, it is desirable that the electrodes, particularly the anodes, be of titanium or a titanium alloy, since the solution melts the electrodes and disable continuous polishing operation, if they are of hard lead, or stainless steel as usual. No further detail of this embodiment is described, since the foregoing description of the first embodiment is substantially equally applicable.

EXAMPLES

Description will now be made of examples in which this invention was put to practice.

Example 1:

A contactless electrolytic polishing apparatus was assembled by putting together in accordance with the layout shown in FIG. 1 two cathode-containing vessels having a width of 23 cm, a length of 45 cm and a depth of 15 cm, two anode-containing vessels having a width of 23 cm, a length of 15 cm and a depth of 15 cm, four solution-discharge vessels having a width of 23 cm, a length of 15 cm and a depth of 15 cm and one solution-discharge vessel having a width of 23 cm, a length of 10 cm and a depth of 15 cm. Insoluble electrodes having a thickness of 0.5 cm, a width of 10 cm and a length of 10 cm and coated with iridium oxide were employed as the anodes, and stainless steel electrodes having a thickness of 0.3 cm, a width of 10 cm and a length of 40 cm as the cathodes.

An elongated blank for a lead frame having a thickness of 0.18 mm and a width of 10 cm, which had been obtained by pressing steel, was degreased and cleansed by 20 seconds of immersion in a degreasing solution prepared by dissolving 50 g of SK-7 of C. Uyemura & Co., Ltd. per liter of water, and having a temperature of 50° C., and was electrolytically polished by employing the contactless electrolytic polishing apparatus as described above, and an electrolytic polishing solution having the composition shown in Table 1 below.

TABLE 1

| | |
|---|---|
| Tripolyphosphoric acid | 35 g/liter |
| Phosphoric acid | 10 g/liter |
| Boric acid | 10 g/liter |
| Potassium carbonate | 2 g/liter |
| Surfactant, AU-150 (product of C. Uyemura & Co., Ltd.) | 0.17 g/liter |
| pH | 5.0 |
| Solution temperature | 40° C. |

A direct current with ripples having a wave cycle or width of 10 ms (milliseconds) was applied in a current pattern defining 23 ripples toward the anode and one ripple toward the cathode in each cycle, so that the surface of the blank might have an average current density of 2.0 A/dm$^2$, while the blank was caused to travel at a speed giving an electrolytic polishing time of 20 seconds. The ripples had a frequency of 50 Hz.

After its electrolytic polishing, the blank was rinsed in water and its surface was visually examined. As a result, the blank surface as a whole was found to have been uniformly wetted with water without having any part repelling water, and so was the pad portion of the lead frame. The surface roughness of the blank was determined by a roughness meter (Surfcom 554A) of Tokyo Seimitsu Co., Ltd. before and after its electrolytic polishing, and a drastically improved smoothness was confirmed, as the blank had an average concavity of 0.1 micron and an average protrusion of 0.04 micron after its polishing treatment, while it had an average concavity of 0.55 micron and an average protrusion of 0.35 micron before its treatment.

Then, the electrolytically polished surface of the blank was neutralized by 10 seconds of immersion in a solution containing 25 g of an Engel substitution inhibitor per liter, and was plated with palladium by spraying a palladium plating solution, Pd-45 of Degussa Japan, against it for 30 seconds at 40° C. and a current density of 1.5 A/dm$^2$, whereby a lead frame was obtained. The thickness of the palladium film on the lead frame was measured by employing a collimator having a diameter of 2 mm and a measuring time of 10 seconds. Six patterns of the lead frame were selected at random for measurement purposes, and the thickness of the palladium film was measured at five points, i.e. the center and four corners of the pad, on each of the front and back of each pattern, and the average values and standard deviations thereof were obtained. The results are shown in Table 2.

TABLE 2

| Pattern No. | | Average value (micron) | Standard deviation |
| --- | --- | --- | --- |
| 1 | Front | 0.188 | 0.008 |
|   | Back  | 0.102 | 0.016 |
| 2 | Front | 0.106 | 0.010 |
|   | Back  | 0.106 | 0.013 |
| 3 | Front | 0.100 | 0.013 |
|   | Back  | 0.098 | 0.013 |
| 4 | Front | 0.110 | 0.009 |
|   | Back  | 0.098 | 0.013 |
| 5 | Front | 0.114 | 0.013 |
|   | Back  | 0.098 | 0.013 |
| 6 | Front | 0.116 | 0.015 |
|   | Back  | 0.104 | 0.009 |

It is obvious from the results shown in Table 2 that the differences in the thickness of the plating film between the front and back of the lead frame fall substantially within the range of allowances.

A bending test was conducted on the lead frame by bending it by 90 degrees and repeating it six times, and its visual inspection did not reveal any cracking, or anything else unusual. A peeling test conducted on the film by employing a customary method did not result in any peeling at all, but confirmed its good adhesive strength. A sample was held at 300° C. for five minutes, but its surface did not show any swelling, or any change in color by heat.

Then, a gold-wire bonding test was conducted to evaluate the palladium-plated lead frame as obtained for its practical use. The test was conducted by employing a bonder FB117 of Kaijo Corporation for bonding a 30-micron gold wire, heating it to 250° C. and cooling it, and a wire breaking test was conducted immediately after cooling, and 24 hours, 48 hours, 72 hours and 96 hours thereafter. The test was repeated 20 times to obtain the minimum, maximum and average values of its breaking strength. The results are shown in Table 3.

TABLE 3

| Condition | Mode | Minimum g | Maximum g | Average g |
| --- | --- | --- | --- | --- |
| Immediately after cooling | BB | 5.0 | 10.9 | 7.3 |
| 24 hours | BB | 4.5 | 10.0 | 6.1 |
| 48 hours | BB | 4.5 | 12.8 | 6.8 |
| 72 hours | BB | 4.7 | 13.1 | 7.0 |
| 96 hours | BB | 4.4 | 13.8 | 6.5 |

It is obvious from the results shown in Table 3 that the lead frame as obtained is satisfactory for practical use, since a minimum breaking strength of 4 g is considered as the lower limit that is practically acceptable.

Example 2:

Example 1 was repeated for making a lead frame and conducting a gold-wire bonding test thereon, except that the electrolytic polishing solution was replaced by one containing 30 g of tripolyphosphoric acid, 8 g of phosphoric acid, 8 g of boric acid, 1 g of potassium carbonate and 0.08 g of surfactant,. AU-150, per liter and having a pH of 5.0 and a temperature of 35° C. The results obtained were substantially equal to those of Example 1, and confirmed that the lead frame was of great practical use.

Example 3:

Example 1 was repeated for making a lead frame and conducting a gold-wire bonding test thereon, except that the electrolytic polishing solution was replaced by one containing 40 g of tripolyphosphoric acid, 12 g of phosphoric acid, 12 g of boric acid, 3 g of potassium carbonate and 0.2 g of surfactant, AU-150, per liter and having a pH of 5.5 and a temperature of 45° C. The results obtained were substantially equal to those of Example 1, and confirmed that the lead frame was of great practical use.

Example 4:

Example 1 was repeated for making a lead frame and conducting a gold-wire bonding test thereon, except that the electrolytically polished blank was treated with a chemical polishing solution, CPB of Mitsubishi Gas Chemical Co., Inc., for 10 seconds, and rinsed in water prior to its palladium plating. The results shown in Table 4 were obtained.

TABLE 4

| Condition | Mode | Minimum g | Maximum g | Average g |
| --- | --- | --- | --- | --- |
| Immediately after cooling | BB | 6.0 | 11.9 | 8.3 |
| 24 hours | BB | 5.5 | 11.0 | 7.1 |
| 48 hours | BB | 4.7 | 13.0 | 7.8 |
| 72 hours | BB | 5.7 | 13.0 | 8.0 |
| 96 hours | BB | 5.4 | 14.0 | 7.2 |

It is obvious from the results shown in Table 4 that the additional chemical polishing after electrolytic polishing enables an improvement of about 1 g in wire bonding strength and thereby an improved reliability.

Example 5:

Example 4 was repeated for making a lead frame and conducting a gold-wire bonding test thereon, except that the chemical polishing of the electrolytically polished blank was replaced by its electrolytic polishing employing an alkaline electrolytic polishing solution containing cyanogen, a current density of 15 A/dm$^2$ and an electrolyzing time of 10 seconds. There were obtained results substantially equal to those of Example 4.

Example 6:

Example 1 was repeated for making a lead frame and conducting a gold-wire bonding test thereon, except that a blank of an iron alloy was employed, and plated with a strike of copper prior to its palladium plating. The results of strength tests as shown in Table 5 were obtained.

TABLE 5

| Condition | Mode | Minimum g | Maximum g | Average g |
|---|---|---|---|---|
| Immediately after cooling | BB | 8.0 | 10.8 | 8.8 |
| 24 hours | BB | 9.5 | 11.1 | 8.3 |
| 48 hours | BB | 5.3 | 9.9 | 7.9 |
| 72 hours | BB | 4.5 | 8.7 | 8.0 |
| 96 hours | BB | 4.6 | 8.6 | 7.7 |

It is obvious from the results shown in Table 5 that even if the blank may be of an iron alloy, its plating with a strike of copper after its electrolytic polishing improves the initial wire-bonding strength, and that there is no obstacle to practical use, though the minimum value drops with the passage of time.

Example 7:

Example 6 was repeated for making a lead frame and conducting a gold-wire bonding test thereon, except that the electrolytically polished blank was treated with the chemical polishing solution, CPB, of Mitsubishi Gas Chemical Co., Inc. for 10 seconds, and rinsed in water prior to its plating with a strike of copper. The results shown in Table 6 were obtained.

TABLE 6

| Condition | Mode | Minimum g | Maximum g | Average g |
|---|---|---|---|---|
| Immediately after cooling | TB | 9.0 | 11.9 | 8.8 |
| 24 hours | BB | 10.4 | 12.1 | 8.3 |
| 48 hours | BB | 6.4 | 10.8 | 7.9 |
| 72 hours | TB | 5.7 | 9.9 | 8.0 |
| 96 hours | BB | 5.4 | 9.8 | 7.7 |

It is obvious from the results shown in Table 6 that the chemical polishing added after electrolytic polishing enables an improvement of about 1 g in wire bonding strength and thereby an improved reliability.

Comparative Example 1:

Example 1 was repeated for making a palladium-plated lead frame, except that the electrolytic polishing of the blank was carried out by employing a conventional method using a simple direct current. There was only obtained a film of palladium which was too low in quality to allow any subsequent gold-wire bonding.

Example 8:

Example 7 was repeated for making a lead frame and conducting a gold-wire bonding test thereon, except that the chemical polishing of the electrolytically polished blank was replaced by its electrolytic polishing employing an alkaline electrolytic polishing solution containing cyanogen, a current density of 15 A/dm$^2$ and an electrolyzing time of 10 seconds. There were obtained results substantially equal to those of Example 7.

Example 9:

A steel blank similar to that employed in Example 1 was electrolytically polished in an acidic electrolytic polishing solution containing 30 g of sulfuric acid, 60 g of ammonium chloride and 0.17 g of surfactant, AU-150, per liter and having a temperature of 45° C., by employing a contactless electrolytic polishing tank of the same construction with that used in Example 1, except that the anodes were formed from steel plates having a thickness of 0.5 cm, a width of 10 cm and a length of 10 cm, and the cathodes from titanium plates having a thickness of 0.3 cm, a width of 10 cm and a length of 40 cm, and by applying a direct current under the same conditions as in Example 1, but varying the ratio of the time for which the current was applied to the blank as the anode, to that for which it was applied to the blank as the cathode. Then, the blank surface was neutralized by 10 seconds of immersion in a solution containing 25 g of Engel substitution inhibitor per liter, and an Engel S-910 silver plating solution having a temperature of 60° C. and a silver content of 60 g/liter was sprayed against the blank surface for 20 seconds to plate it with silver at a current density of 50 A/dm$^2$. Thus, examination was made of the effects which the varying ratio of time as stated above had exerted on the condition of a film of silver formed on the blank.

The surface of the silver film was visually inspected for any burnt deposit thereon. The results are shown in Table 7.

Table 7 shows the time for which the blank functioned as the anode during one cycle, and the time for which it functioned as the cathode, along the axes of ordinate and abscissa, respectively. The time is shown in ms (milliseconds). In Table 7, o means that a good film of silver was obtained, while ∠ means that a burnt deposit was found.

TABLE 7

| Anode time \ Cathode time | 10 | 20 | 30 | 40 | 50 | 60 | 70 | 80 | 90 |
|---|---|---|---|---|---|---|---|---|---|
| 290 | o | o | o | o | o | o | o | o | ∠ |
| 260 | o | o | o | o | o | o | o | o | ∠ |
| 230 | o | o | o | o | o | o | ∠ | ∠ | ∠ |
| 200 | o | o | o | o | o | ∠ | ∠ | ∠ | ∠ |
| 150 | o | o | o | o | ∠ | ∠ | ∠ | ∠ | ∠ |
| 100 | o | o | o | ∠ | ∠ | ∠ | ∠ | ∠ | ∠ |

It is obvious from the results shown in Table 7 that good results can be obtained if the time for which a direct current with ripples acts upon the blank as the anode is at least about 3.3 times longer than that for which it acts upon the blank as the cathode.

The process of this invention for manufacturing lead frames as described above is of great utility, since it can perform the electrolytic polishing of blanks for lead frames continuously for a long period of time, form an electrolytically polished blank surface of high smoothness, and make a lead frame plated with a smooth metal film of high adhesive strength by plating the electrolytically polished surface directly without the aid of any strike plating, and enabling any subsequent bonding of, e.g., a gold wire to be reliably done. Moreover, this invention enables the manufacture of palladium-plated lead frames by employing a neutral electrolytic polishing solution without employing any expensive nickel strike plating, or electroplating, and also enables a long time of continuous operation with even an acidic electrolytic polishing solution if titanium electrodes are employed. For these and other reasons, this invention is of great importance from an economical standpoint, too.

We claim:

1. A process for manufacturing a lead frame by polishing a blank for a lead frame electrolytically and plating the electrolytically polished surface of the blank with a metal, wherein the electrolytic polishing of the blank is carried out by employing a contactless electrolytic polishing apparatus and applying a direct current with ripples having a frequency of 4.0 to 120 Hz alternately to the anode and cathode in an electrolytic polishing tank filled with an electrolytic polishing solution, so that the time for which the blank positioned between both electrodes functions as the anode may be at least 3.3 times longer than that for which it functions as the cathode, whereafter the blank is plated with a metal.

2. A process as set forth in claim 1, wherein said polishing is carried out after said blank has been degreased and cleansed.

3. A process as set forth in claim 1, wherein said solution is a neutral electrolyte containing 30 to 40 g of tripolyphosphoric acid, 8 to 12 g of phosphoric acid, 8 to 12 g of boric acid, 1 to 3 g of potassium carbonate and 0.08 to 0.2 g of a nonionic surfactant per liter and having a pH of 4.8 to 5.8 and a temperature of 35° C. to 45° C.

4. A process as set forth in claim 3, wherein said polishing is carried out by employing an average current density of 1.0 to 4.0 A/dm$^2$.

5. A process as set forth in claim 1, wherein said solution is an acidic electrolytic polishing solution containing 20 to 40 g of sulfuric acid, 40 to 80 g of ammonium chloride and 0.08 to 0.25 g of a nonionic surfactant per liter and having a temperature of 45° C. to 50° C.

6. A process as set forth in claim 5, wherein said polishing is carried out by employing an average current density of 1.0 to 3.0 A/dm$^2$.

7. A process as set forth in claim 5, wherein said polishing is carried out by employing titanium or a titanium alloy for the electrodes.

8. A process as set forth in claim 1, wherein said plating is carried out after chemical polishing of the electrolytically polished blank, or its electrolytic polishing in a cyanogen solution.

9. A process as set forth in claim 1, wherein said plating is carried out with silver.

10. A process as set forth in claim 9, wherein said plating with silver is carried out after the electrolytically polished blank has been plated with a strike of copper.

11. A process as set forth in claim 1, wherein said plating is carried out with palladium.

12. A process as set forth in claim 11, wherein said plating with palladium is carried out after the electrolytically polished blank has been plated with a strike of copper.

13. A process for manufacturing a lead frame comprising degreasing and cleansing a blank for a lead frame; polishing said blank electrolytically by employing a contactless electrolytic polishing apparatus having an electrolytic tank filled with a neutral electrolyte containing 30 to 40 g of tripolyphosphoric acid, 8 to 12 g of phosphoric acid, 8 to 12 g of boric acid, 1 to 3 g of potassium carbonate and 0.08 to 0.2 g of a nonionic surfactant per liter and having a pH of 4.8 to 5.8 and a temperature of 35° C. to 45° C. as an electrolytic polishing solution, and applying a direct current with ripples having a frequency of 40 to 120 Hz alternately to the anode and cathode in said tank, so that the time for which said blank functions as the anode may be at least 3.3 times longer than that for which it functions as the cathode; polishing said blank chemically, or electrolytically in a cyanogen solution; plating said blank with a strike of copper; and plating it with palladium.

* * * * *